(12) United States Patent
Feiring et al.

(10) Patent No.: US 7,312,287 B2
(45) Date of Patent: Dec. 25, 2007

(54) FLUORINATED POLYMERS USEFUL AS PHOTORESISTS, AND PROCESSES FOR MICROLITHOGRAPHY

(75) Inventors: Andrew Edward Feiring, Wilmington, DE (US); Frank L. Schadt, III, Wilmington, DE (US); William Brown Farnham, Hockessin, DE (US); Jerald Feldman, Wilmington, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 148 days.

(21) Appl. No.: 10/523,490

(22) PCT Filed: Aug. 19, 2003

(86) PCT No.: PCT/US03/26088

§ 371 (c)(1),
(2), (4) Date: Feb. 3, 2005

(87) PCT Pub. No.: WO2004/016664

PCT Pub. Date: Feb. 26, 2004

(65) Prior Publication Data

US 2006/0166129 A1    Jul. 27, 2006

(51) Int. Cl.
*C08F 120/22*    (2006.01)
(52) U.S. Cl. .............. 526/245; 526/247; 526/249; 526/250; 526/255; 428/14; 430/270.1; 430/315
(58) Field of Classification Search ............. 526/250, 526/249, 255, 247; 430/270.1, 315; 428/14
See application file for complete search history.

(56) References Cited

U.S. PATENT DOCUMENTS 5,229,473 A * 7/1993 Kobo et al. ................. 526/249
6,593,058 B1   7/2003 Feiring et al.
2003/0215735 A1 * 11/2003 Wheland et al. ......... 430/270.1

FOREIGN PATENT DOCUMENTS

| EP | 1246013 A2 * | 10/2002 |
| WO | WO 0067072 | 11/2000 |
| WO | WO-2004/016664 A1 * | 2/2004 |

OTHER PUBLICATIONS

Reichmanis et. al., "The Effect of Substituents on the Photosensitivity of 2-Nitrobenzyl Ester Deep UV Resists", J. Electrochem. Soc., vol. 130, 1433-1437, 1983.
Posner et. al., A Mechanistic and Synthetic Study of Organocopper Substitution Reactions With Some Homoallylic and Cyclopropylcarbinyl Substrates, Tetrahedron, vol. 32, 2281-2287, 1976.
Gallagher et. al., Electrophile-Mediated Cyclisations Involving the Allene System, Stereoselectivity and Synthetic Utility of PD-Catalysed Heteroatom Cyclisation Reactions. X-Ray Molecular Structure of Methyl 2-Trans-3-Phenyl-N-(P-Tolylsulfonyl) Pyrolidin-2-Yi Acrylate, J. Chem. Soc. Perkin Trans 1, 1992, pp. 433-440.

* cited by examiner

Primary Examiner—David W. Wu
Assistant Examiner—Henry S. Hu

(57) ABSTRACT

This invention provides a fluorine-containing copolymer having a repeat unit derived from at least one fluorinated olefin and a repeat unit derived from at least one polycyclic ethylenically unsaturated monomer having pendant hydroxyl or esterified hydroxyl groups, and optionally other repeat units, typically derived from an acrylate. These polymers have high transparency at short wavelengths such as 193 nm and 157 nm, and provide good plasma etch resistance and adhesive properties. Also provided are photoresist compositions and substrates coated therewith.

12 Claims, No Drawings

FLUORINATED POLYMERS USEFUL AS PHOTORESISTS, AND PROCESSES FOR MICROLITHOGRAPHY

BACKGROUND OF THE INVENTION

The present invention pertains to fluorine-containing polymers which comprise at least one fluorinated olefin, at least one polycyclic ethylenically unsaturated monomer having pendant hydroxyl or esterified hydroxyl groups and, optionally, other components. The polymers are useful for photoimaging compositions and, in particular, photoresist compositions (positive-working and/or negative-working) for imaging in the production of semiconductor devices. The polymers are especially useful in photoresist compositions having high UV transparency (particularly at short wavelengths, e.g., 157 nm) as the binder of the photoresist composition and potentially in many other applications.

There is a need for polymers useful in photoresist compositions for microlithography at 193 nm, and particularly at 157 nm, or lower that have not only high transparency at these short wavelengths but also suitable other key properties, including good plasma etch resistance and adhesive properties.

SUMMARY OF THE INVENTION

This invention provides a fluorine-containing copolymer comprising:
(a) a repeat unit derived from an ethylenically unsaturated compound having at least one fluorine atom covalently attached to an ethylenically unsaturated carbon atom; and
(b) a repeat unit derived from an ethylenically unsaturated cyclic compound of structure:

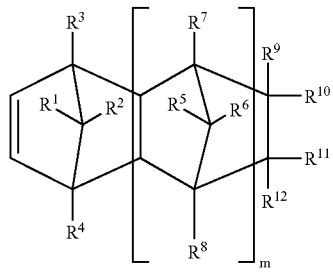

wherein m is 0, 1 or 2;
$R^1$ to $R^{12}$ are independently H, halogen, carboxyl, OH, or $O_2C-R^{13}$, wherein $R^{13}$ is a $C_1-C_{20}$ hydrocarbon group and at least one of $R^1$ to $R^{12}$ is OH or $O_2C-R^{13}$.

The invention also provides a photoresist composition prepared from a copolymer of this invention and a photoactive component, processes for preparing a photoresist image on a substrate and imageable articles of manufacture.

DETAILED DESCRIPTION OF THE PREFERRED EMBODIMENTS

Fluorine-containing Copolymer

The fluorine-containing copolymer comprises a repeat unit derived from an ethylenically unsaturated cyclic monomer of structure:

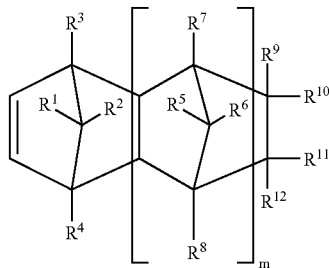

wherein m is 0, 1 or 2;
$R^1$ to $R^{12}$ are independently H, halogen, carboxyl, OH, or $O_2C-R^{13}$, wherein $R^{13}$ is a $C_1-C_{20}$ hydrocarbon group and at least one of $R^1$ to $R^{12}$ is OH or $O_2C-R^{13}$.
Preferably, $R^{13}$ is a linear or alkyl group, preferably $R^{13}$ contains 1 to 10 carbon atoms. Typically $R^{13}$ is methyl, ethyl or propyl. Typically where $R^1$ to $R^{12}$ is halogen it is chlorine, fluorine or bromine.

Representative and preferred ethylenically unsaturated polycyclic compounds are norbor-5-en-2-ol (abbreviated NB—OH) and norborn-5-en-2-ol acetate (abbreviated NB—OAc).

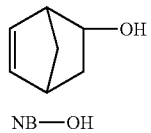 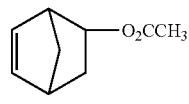

NB—OH       NB—OAc

The ethylenically unsaturated cyclic monomers described herein are polycyclic and have pendant hydroxyl or esterified hydroxyl groups, such monomers are prepared by processes known in the art. In one such process, a vinyl ester, e.g., vinyl acetate, can be reacted with cyclopentadiene. In an alternative process, a carboxylic acid, such as acetic acid, can be reacted with norbornadiene. These processes give polycyclic ethylenically unsaturated compounds having esterified hydroxyl groups. The esterified hydroxyl group can be converted to a hydroxyl group by known processes, such as by treatment with sodium, potassium or tetramethylammonium hydroxide in aqueous alcohol solutions.

The fluorine-containing copolymer further comprises a repeat unit derived from at least one ethylenically unsaturated compound (a fluoroolefin) containing at least one fluorine atom attached to an ethylenically unsaturated carbon atom. The fluoroolefin comprises 2 to 20 carbon atoms and, preferably, the olefinic unsaturation is in a terminal position. In such a fluoroolefin, the terminal carbon of the olefinic linkage is bonded to at least one fluorine atom and the remaining carbon of the olefinic linkage is singly bonded to hydrogen, fluorine, chlorine, bromine, an omega-hydroperfluoroalkyl group of no more than 10 carbon atoms, or a perfluoroalkyl group of no more than 10 carbon atoms.

Representative fluoroolefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2=O(CF_2)_tCF=CF_2$, where t is 1 or 2, and $R_fOCF_2=CF_2$ wherein $R_f$ is a saturated fluoroalkyl group of from 1 to 10 carbon atoms. A preferred fluoroolefin is tetrafluoroethylene.

The presence of at least one polycyclic comonomer (i.e., a comonomer comprising at least two rings, e.g., norbornene) is important for photoresist applications for three main reasons: 1) polycyclic monomers have relatively high carbon to hydrogen ratios (C:H), which results in polymers comprised of repeat units of these polycyclic monomers generally having good plasma etch resistance; 2) polymers having repeat units derived from polyclic monomers, which preferably can be fully saturated upon polymerization, generally have good transparency characteristics; and 3) polymers prepared from polycyclic monomers usually have relatively high glass transition temperatures for improved dimensional stability during processing. The presence of a hydroxyl group or an esterified hydroxyl group on the polycyclic structure may provide additional properties such as improved adhesion.

As is well known to those skilled in the polymer art, an ethylenically unsaturated compound undergoes free radical polymerization to afford a polymer having a repeat unit that is derived from the ethylenically unsaturated compound. Free radical polymerization processes may be employed to prepare polymers comprising a repeat unit derived from at least one ethylenically unsaturated compound having at least one fluorine atom covalently attached to an ethylenically unsaturated carbon atom and at least one ethylenically unsaturated cyclic compound.

The polymers of this invention comprising a polycyclic repeat unit with a pendant hydroxyl group may be prepared by polymerizing a polycyclic ethylenically unsaturated monomer (e.g., NB—OH) having a pendant hydroxyl group. However, it is known in the art that aliphatic hydroxyl groups may cause undesirable chain transfer during the course of polymerization. Thus, it may be preferred to polymerize a polycyclic ethylenically unsaturated monomer having an esterified hydroxyl group, e.g., NB—OAc. One or more of the esterified hydroxyl groups in the polymer can then be converted to a hydroxyl group by known processes such as by hydrolysis using an alkali metal hydroxide, ammonium hydroxide or tetramethyl ammonium hydroxide. The hydrolysis process is typically conducted in solution in the presence of water and an aliphatic alcohol such as methanol. All or a portion of the esterified hydroxyl groups of the polymer may be converted.

The polymers of this invention can further comprise one or more additional repeat units derived from other comonomers. For example, the polymer of this invention may also comprise a fluoroalcohol group. The fluoroalcohol group can be derived from an ethylenically unsaturated compound containing a fluoroalcohol group having the structure:

—C(R$_f$)(R$_f'$)OH wherein R$_f$ and R$_f'$ are the same or different fluoroalkyl groups of from 1 to 10 carbon atoms or taken together are (CF$_2$)$_n$ wherein n is 2 to 10. R$_f$ and R$_f'$ can be partially fluorinated alkyl groups or fully fluorinated alkyl groups (i.e., perfluoroalkyl groups). The phrase "taken together" indicates that R$_f$ and R$_f'$ are not separate, discrete fluorinated alkyl groups, but that together they form a ring structure such as is illustrated below in case of a 5-membered ring:

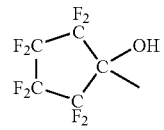

R$_f$ and R$_f'$ can be partially fluorinated alkyl groups without limit according to the invention except that there must be a sufficient degree of fluorination present to impart acidity to the hydroxyl (—OH) of the fluoroalcohol functional group, such that the hydroxyl proton is substantially removed in basic media, such as in aqueous sodium hydroxide solution or tetraalkylammonium hydroxide solution. In preferred cases according to the invention, there will be sufficient fluorine substitution present in the fluorinated alkyl groups of the fluoroalcohol functional group such that the hydroxyl group will have a pKa value of 5-11. Preferably, R$_f$ and R$_f'$ are independently perfluoroalkyl group of 1 to 5 carbon atoms, and, most preferably, R$_f$ and R$_f'$ are both trifluoromethyl (CF$_3$).

The fluorinated polymers, photoresists, and processes of this invention that contain a fluoroalcohol functional group can also have the structure:

—XCH$_2$C(R$_f$)(R$_f'$)OH wherein R$_f$ and R$_f'$ are as described above, X is an element from Group VA and VIA of the Periodic Table of the Elements (CAS Version), for example, oxygen, sulfur, nitrogen and phosphorous. Oxygen is the preferred X group.

Some illustrative, but nonlimiting, examples of representative comonomers containing a fluoroalcohol functional group and within the scope of the invention are presented below:

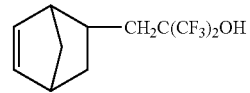

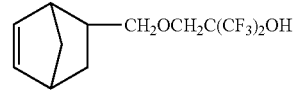

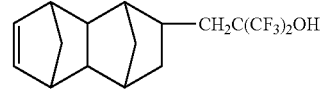

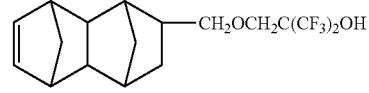

CH$_2$=CHOCH$_2$CH$_2$OCH$_2$C(CF$_3$)$_2$OH

CH$_2$=CHO(CH$_2$)$_4$OCH$_2$C(CF$_3$)$_2$OH

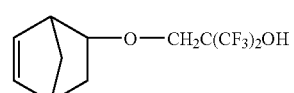

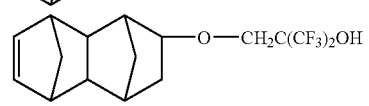

The copolymer can further comprise an acid-containing or protected acid-containing structural unit:

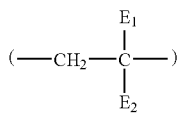

in which $E_1$ is H or $C_1$-$C_{12}$ alkyl; $E_2$ is $CO_2E_3$, $SO_3E$, or other acidic group; and E and $E_3$ are H or unsubstituted or heteroatom-substituted $C_1$-$C_{12}$ alkyl. Suitable heteroatoms include oxygen, nitrogen, sulfur, halogen and phosphorus. When the heteroatom is oxygen, the substituent can contain a hydroxyl group. Alkyl groups can contain one to twelve carbon atoms, preferably one to eight. A preferred acid-containing polymer for aqueous processability (aqueous development) in use as a binder in a photoresist is a carboxylic acid-containing copolymer. The level of carboxylic acid groups is determined for a given composition by optimizing the amount needed for good development in aqueous alkaline developer.

The acid-containing structural unit can be derived from an acrylate. Tertiary alkyl acrylates such as tert-butyl acrylate and 2-methyl-2-adamantyl acrylate may provide acid-sensitive functionality for image formation. Other acrylates, such as acrylic acid, methyl acrylate, ethyl acrylate and propyl acrylate can be employed to modify the adhesion or solubility of the polymer. In one embodiment tert-butylacrylate, can be incorporated into the polymer, which introduces acid-labile tert-butyl ester groups.

Additional polar monomers such as vinyl acetate may also be incorporated into the copolymer in order to assist aqueous development or otherwise modify polymer properties. Hydrolysis of the vinyl acetate monomer to vinyl alcohol can also be useful.

The fluoroalcohol group and/or other acid group of the polymer can contain a protecting group that protects the fluorinated alcohol group and/or other acid group (i.e., the protected group) from exhibiting its acidity while in this protected form. As one illustrative example, the tertiary-butyl group is the protecting group in a tertiary-butyl ester and this protecting group protects the free acid. In undergoing deprotection (conversion of protected acid to free acid), the ester is converted to the corresponding acid.

An alpha-alkoxyalkyl ether group is a preferred protecting group for the fluoroalcohol group in order to maintain a high degree of transparency in the photoresist composition. The resulting protected fluoroalcohol group has the structure:

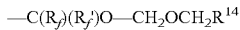

In this protected fluoroalcohol, $R_f$ and $R_f'$ are as described above; $R^{14}$ is hydrogen or a linear or branched alkyl group of between 1 and 10 carbon atoms. An illustrative, but non-limiting example, of an alpha-alkoxyalkyl ether group, which is effective as a protecting group in a protected acid group, is methoxy methyl ether (MOM). A protected fluoroalcohol with this particular protecting group can be obtained by reaction of chloromethylmethyl ether with the fluoroalcohol.

The fluoroalcohol functional group (protected or unprotected) of this invention can be used alone or in combination with one or more other acid groups, such as a carboxylic acid functional group (unprotected) or a t-butyl ester of carboxylic acid functional group (protected).

In this invention, often, but not always, the components having protected groups are repeat units having protected acid groups that have been incorporated in the base copolymer resins of the compositions.

Frequently the protected acid groups are present in one or more comonomers that are polymerized to form the copolymer of this invention. Alternatively, in this invention, a copolymer can be formed by copolymerization with an acid-containing comonomer and then subsequently acid functionality in the resulting acid-containing copolymer can be partially or wholly converted by appropriate means to derivatives having protected acid groups.

The preferred process for polymerizing the fluorine-containing copolymers of this invention is radical addition polymerization. Any suitable polymerization initiator, such as di-(4-tert-butylcyclohexyl)peroxy-dicarbonate, can be used under appropriate conditions. The polymerization pressure can range from about 50 to about 10,000 psig, preferably from about 200 to about 1,000 psig. The polymerization temperature can range from about 30° C. to about 120° C., preferably from about 40° C. to about 80° C. Suitable solvents include 1,1,2-trichlorofluoroethane and non-chlorofluorocarbon solvents such as 1,1,1,3,3-pentafluorobutane. The polymerization process is further enhanced by a semibatch synthesis. In the semibatch synthesis, a part of the monomer mixture is placed in the reaction vessel and then, portionwise or continuously, the remaining monomers and initiator are added to the vessel throughout the polymerization process.

Photoresist Development

Protective Groups for Removal by PAC Catalysis

Photoactive Component (PAC)

The photoresist compositions of this invention contain at least one photoactive component (PAC) that can produce either acid or base upon exposure to actinic radiation during the development process. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure III), 2) iodonium salts (structure IV), and 3) hydroxamic acid esters, such as structure V.

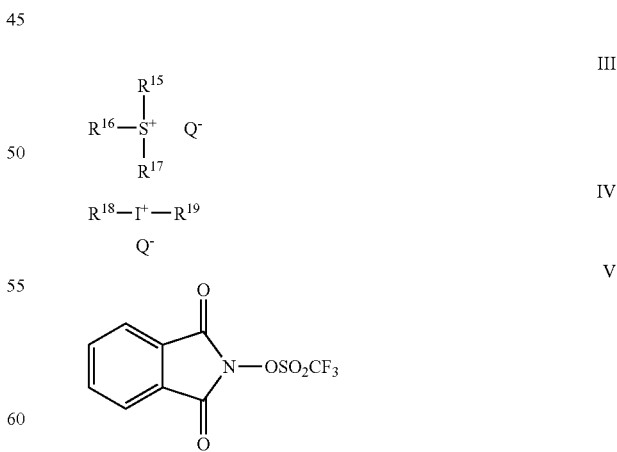

In structures III to IV, $R^{15}$ to $R^{19}$ are, independently, substituted or unsubstituted $C_6$ to $C_{20}$ aryl, or substituted or unsubstituted $C_7$-$C_{40}$ alkylaryl or aralkyl. Representative aryl groups include, but are not limited to, phenyl, naphthyl, and anthracenyl. Suitable heteroatom substituents include, but are not limited to one or more oxygen, nitrogen, halogen or sulfur atoms. When the heteroatom is oxygen, the substituent can contain hydroxyl (—OH) or $C_1$-$C_{20}$ alkyloxy (e.g., $C_{10}H_{21}O$). The anion $Q^-$ in structures III-IV can be, but is not limited to, $SbF_6$-(hexafluoroantimonate), $CF_3SO_3$-(trifluoromethylsulfonate=triflate), and $C_4F_9SO_3$-(perfluorobutylsulfonate).

Functionality for Development

For use in a photoresist composition, the fluorine-containing copolymer should contain sufficient functionality to render the photoresist developable so as to produce a relief image, following imagewise exposure to ultraviolet radiation having wavelength of $\leq 365$ nm. In some preferred embodiments, the sufficient functionality is selected from an acid and/or a protected acid group, as described above. Such acid or protected acid groups have been found to render the exposed portions of photoresist soluble in basic solution upon exposure to sufficient ultraviolet radiation having a wavelength of $\leq 365$ nm while the unexposed portions are insoluble in the basic solution.

For development, one or more groups within the fluorine-containing copolymers should contain one or more components having protected acid groups that can yield, by catalysis of acids or bases generated photolytically from the photoactive compound (PAC), hydrophilic acid or base groups.

A given protected acid group is one that is normally chosen on the basis of its being acid labile, such that when photoacid is produced upon imagewise exposure, the acid will catalyze deprotection and production of hydrophilic acid groups that are necessary for development under aqueous conditions. In addition, the fluorine-containing copolymers may also contain acid functionality that is not protected.

Examples of basic developer include but are not limited to sodium hydroxide solution, potassium hydroxide solution, or ammonium hydroxide solution. Specifically a basic developer is an aqueous alkaline liquid such as a wholly aqueous solution containing 0.262 N tetramethylammonium hydroxide (with development at 25° C. usually for $\leq 2$ min) or 1% sodium carbonate by weight (with development at a temperature of 30° C. usually for $\leq 2$ min).

When an aqueous processable photoresist is coated or otherwise applied to a substrate and imagewise exposed to UV light, development of the photoresist composition may require that the binder material contain sufficient acid groups (e.g., carboxylic acid groups) and/or protected acid groups that are at least partially deprotected upon exposure to render the photoresist (or other photoimageable coating composition) processable in aqueous alkaline developer.

In one embodiment of this invention, the copolymer having one or more protected acid groups yield a carboxylic acid as the hydrophilic group upon exposure to photogenerated acid. Such protected acid groups include, but are not limited to, A) esters capable of forming, or rearranging to, a tertiary cation, B) esters of lactone, C) acetal esters, D) β-cyclic ketone esters, E) α-cyclic ether esters, and F) MEEMA (methoxy ethoxy ethyl methacrylate) and other esters which are easily hydrolyzable because of anchimeric assistance. Some specific examples in category A) are t-butyl ester, 2-methyl-2-adamantyl ester, and isobornyl ester.

An especially preferred acidic group is the hexafluoroisopropanol group which may be incorporated by use of hexafluoroisopropanol-containing monomers as illustrated by examples. Some or all of the hexafluoroisopropanol groups may be protected as, for example, acid-labile alkoxymethyl ethers or tert-butylcarbonates.

Examples of components having protected acid groups that yield an alcohol as the hydrophilic group upon exposure to photogenerated acid or base include, but are not limited to, t-butoxycarbonyl (t-BOC), t-butyl ether, and 3-cyclohexenyl ether.

In the case of a negative-working photoresist layer, the photoresist layer will be removed during development in portions which are unexposed to UV radiation but will be substantially unaffected in exposed portions during development using either a critical fluid or an organic solvent.

Dissolution Inhibitors and Additives

Various dissolution inhibitors can be utilized in this invention. Ideally, dissolution inhibitors (DIs) for far and extreme UV resists (e.g., 193 nm resists) should be designed/chosen to satisfy multiple materials needs including dissolution inhibition, plasma etch resistance, and adhesion behavior of resist compositions comprising a given DI additive. Some dissolution inhibiting compounds also serve as plasticizers in resist compositions.

A variety of bile-salt esters (i.e., cholate esters) are particularly useful as DIs in the compositions of this invention. Bile-salt esters are known to be effective dissolution inhibitors for deep UV resists, beginning with work by Reichmanis et al. in 1983. (E. Reichmanis et al., "The Effect of Substituents on the Photosensitivity of 2-Nitrobenzyl Ester Deep UV Resists", *J. Electrochem. Soc.* 1983, 130, 1433-1437.) Bile-salt esters are particularly attractive choices as DIs for several reasons, including their availability from natural sources, their high alicyclic carbon content, and particularly for their transparency in the deep and vacuum UV region, (which essentially is also the far and extreme UV region), of the electromagnetic spectrum. Typically, they are highly transparent at 193 nm. Furthermore, the bile-salt esters are also attractive DI choices since they may be designed to have widely ranging hydrophobic to hydrophilic compatibilities depending upon hydroxyl substitution and functionalization.

Representative bile-acids and bile-acid derivatives that are suitable as additives and/or dissolution inhibitors for this invention include, but are not limited to cholic acid, deoxycholic acid, lithocholic acid, t-butyl deoxycholate, t-butyl lithocholate, and t-butyl-3-α-acetyl lithocholate.

The invention is not limited to use of bile-acid esters and related compounds as dissolution inhibitors. Other types of dissolution inhibitors, such as various diazonaphthoquinones (DNQs) and diazocoumarins(DCs), can be utilized in this invention in some applications. Diazanaphthoquinones and diazocoumarins are generally suitable in resists compositions designed for imaging at higher wavelengths of UV light (e.g., 365 nm and perhaps at 248 nm). These dissolution inhibitors are generally not preferred in resist compositions designed for imaging with UV light at 193 nm or lower wavelengths, since these compounds absorb strongly in this region of the UV and are usually not sufficiently transparent for most applications at these low UV wavelengths.

Solvents:

Photoresists of this invention are prepared as coating compositions by dissolving the components of the photoresist in a suitable solvent, for example, ether esters such as propyleneglycol monomethyl ether acetate, 2-ethoxyethyl acetate, 2-methoxyethyl acetate, and ethyl 3-ethoxypropionate; ketones such as cyclohexanone, 2-heptanone, and methyl ethyl ketone; esters such as butyl acetate, ethyl lactate, methyl lactate, and ethyl acetate; glycol ethers such as propylene glycol monomethyl ether, ethylene glycol monomethyl ether, ethyleneglycol monoethyl ether, and 2-methoxyethyl ether (diglyme); unsubstituted and substituted hydrocarbons and aromatic hydrocarbons such as hexane, toluene, and chlorobenzene; and fluorinated solvents such as CFC-113 (1,1,2-trichlorotrifluoromethane, E.I. du Pont de Nemours and Company), and 1,2-bis(1,1,2,2-tetrafluoroethoxy)ethane. High boiling solvents can be added, for example, xylene or other unsubstituted or substituted aromatic hydrocarbons; ethers such as benzyl ethyl ether, and dihexyl ether; glycol ethers such as diethyleneglycol monomethyl ether, and diethyleneglycol monoethyl ether; ketones such as acetonylacetone, and isophorone; alcohols such as 1-octanol, 1-nonanol, and benzylalcohol; esters such as benzyl acetate, ethyl benzoate, diethyl oxalate, diethyl maleate, ethylene carbonate, and propylene carbonate; and lactones such as γ-butyrolactone and δ-valerolactone. Alternatively, supercritical $CO_2$ may be useful as a solvent. These solvents may be used alone or in admixture of two or more. Typically, the solids content of the photoresist varies between 5 and 50 percent by weight of the total weight of the photoresist composition.

Other Components

The compositions of this invention can contain optional additional components. Examples of additional components which can be added include, but are not limited to, bases, surfactants, resolution enhancers, adhesion promoters, residue reducers, coating aids, plasticizers, and $T_g$ (glass transition temperature) modifiers.

Process Steps

For microlithography, the photoresist composition is applied to a suitable substrate such as a microelectronic wafer typically employed in the semiconductor industry. The solvent is then removed by evaporation.

Imagewise Exposure

The photoresist compositions of this invention are sensitive in the ultraviolet region of the electromagnetic spectrum and especially to those wavelengths ≦365 nm. Imagewise exposure of the photoresist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, more preferably with ultraviolet light of 193 nm, 157 nm, or lower wavelengths, and is still more preferably with ultraviolet light of 157 nm or lower wavelengths. Imagewise exposure can either be done digitally with a laser or equivalent device or non-digitally with use of a photomask. Digital imaging with a laser is preferred. Suitable laser devices for digital imaging of the compositions of this invention include, but are not limited to, argon-fluorine excimer lasers with UV output at 193 nm, krypton-fluorine excimer lasers with UV output at 248 nm, or fluorine (F2) lasers with output at 157 nm. Since, as discussed supra, use of UV light of lower wavelength for imagewise exposure corresponds to higher resolution (lower resolution limit), the use of a lower wavelength (e.g., 193 nm or 157 nm or lower) is generally preferred over use of a higher wavelength (e.g., 248 nm or higher). Specifically, imaging at 157 nm is preferred over imaging at 193 nm.

The photoresists of this invention are useful for 365 nm (I-line), 248 nm (KrF laser), and especially 193 nm (ArF laser) and 157 nm (F2 laser) microlithography. For imaging at 193 and 157 nm, it is preferred that the polymer is substantially free of aromatic groups because these absorb significant amounts of light at these wavelengths. These photoresists are critical in allowing for the imaging of feature sizes in the submicron range.

Substrate

The substrate employed in this invention can be silicon, silicon oxide, silicon oxynitride, silicon nitride, or various other materials used in semiconductive manufacture. In a preferred embodiment, the substrate can be in the form of a microelectronic wafer. The microelectronic wafer can be prepared from silicon, silicon oxide, silicon oxynitride, or silicon nitride.

| GLOSSARY | |
|---|---|
| Analytical/Measurements | |
| bs | broad singlet |
| δ | NMR chemical shift measured in the indicated solvent |
| g | gram |
| NMR | Nuclear Magnetic Resonance |
| $^1$H NMR | Proton NMR |
| $^{13}$C NMR | Carbon-13 NMR |
| $^{19}$F NMR | Fluorine-19 NMR |
| s | singlet |
| sec. | second(s) |
| m | multiplet |
| mL | milliliter(s) |
| mm | millimeter(s) |
| $T_g$ | Glass Transition Temperature |
| $M_n$ | Number-average molecular weight of a given polymer |
| $M_w$ | Weight-average molecular weight of a given polymer |
| $P = M_w/M_n$ | Polydispersity of a given polymer |
| Absorption coefficient | AC = A/b, where A, absorbance, = $Log_{10}(1/T)$ and b = film thickness in microns, where T = transmittance as defined below. |

-continued

GLOSSARY

| | |
|---|---|
| Transmittance | Transmittance, T, = ratio of the radiant power transmitted by a sample to the radiant power incident on the sample and is measured for a specified wavelength $\lambda$ (e.g., nm). |
| Chemicals/Monomers | |
| CFC-113 | 1,1,2-Trichlorotrifluoroethane<br>E. I. du Pont de Nemours and Company, Wilmington, DE |
| MAdA | 2-Methyl-2-adamantyl acrylate<br>OHKA America, Inc., Milpitas, CA |
| Perkadox ® 16 N | Di-(4-tert-butylcyclohexyl)Peroxydicarbonate<br>Noury Chemical Corp., Burt, NY |
| Solkane 365 mfc | 1,1,1,3,3-Pentafluorobutane<br>Solvay Fluor, Hannover, Germany |
| t-BuAc | tert-Butyl acrylate<br>Aldrich Chemical Company, Milwaukee, WI |
| TFE | Tetrafluoroethylene<br>E. I. du Pont de Nemours and Company, Wilmington, DE |
| THF | Tetrahydrofuran<br>Aldrich Chemical Co., Milwaukee, WI |
| NB—Me—OH<br>NB—Me—F—OH<br>NB—Me—F—OMOM | X = OH<br>X = OCH$_2$C(CF$_3$)$_2$OH<br>X = OCH$_2$C(CF$_3$)$_2$OCH$_2$OCH$_3$  |
| NB—OAc<br>NB—OH<br>NB—FOH<br>NB—F—OMOM | X = OCOCH$_3$<br>X = OH<br>X = OCH$_2$C(CF$_3$)$_2$OH<br>X = OCH$_2$C(CF$_3$)$_2$OCH$_2$OCH$_3$ 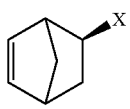 |
| VE-F—OH<br>VE-F—OMOM | CH$_2$ = CHOCH$_2$CH$_2$OCH$_2$C(CF$_3$)$_2$OH<br>CH$_2$ = CHOCH$_2$CH$_2$OCH$_2$C(CF$_3$)$_2$OCH$_2$OCH$_3$ |

NB—OAc and NB—OH were prepared as described by Posner et al. *Tetrahedron*, vol. 32, page 2281 (1976) and Davies et al. *J. Chem. Soc.* Perkin I, page 433 (1973). NB—F—OH, NB—F—OMOM, NB-Me-F—OH and NB-Me-F—OMOM were prepared as described by Feiring and Feldman, PCT Int. Appl. WO 2000067072 (Nov. 9, 2000).

Ultraviolet

Extreme UV Region of the electromagnetic spectrum in the ultraviolet that ranges from nanometers to 200 nanometers Far UV Region of the electromagnetic spectrum in the ultraviolet that ranges from 200 nanometers to 300 nanometers UV Ultraviolet region of the electromagnetic spectrum which ranges from 10 nanometers to 390 nanometers Near UV Region of the electromagnetic spectrum in the ultraviolet that ranges from 300 nanometers to 390 nanometers

EXAMPLES

Unless otherwise specified, all temperatures are in degrees Celsius, all mass measurements are in grams, and all percentages are weight percentages, except for polymer compositions, which are expressed as mole % of the constitutent monomer repeat units.

Glass transition temperatures ($T_g$) were determined by DSC (differential scanning calorimetry) using a heating rate of 20° C./min, data is reported from the second heat. The DSC unit used is a Model DSC2910 made by TA Instruments, Wilmington, Del.

Assessment of 157 nm imaging sensitivity can be done using a Lambda-Physik Compex 102 excimer laser configured for 157 nm operation. Vacuum ultraviolet transmission measurements are made using a McPherson spectrometer equipped with a D2 light source. Samples are spin-coated at several thicknesses on CaF$_2$ substrates, and the contribution of the substrate to the transmission is approximately removed by spectral division.

More specifically, all absorption coefficient measurements for polymers can be made using the procedure listed below.

1. Samples are first spin-coated on silicon wafers on a Brewer Cee (Rolla, Mo.), Spincoater/Hotplate model 100CB.

a) Two to four silicon wafers are spun at different speeds (e.g., 2000, 3000, 4000, 6000 rpm) to obtain differing film thickness and the coated wafers are subsequently baked at 120° C. for 30 min. The dried films were then measured for thickness on a Gaertner Scientific (Chicago, Ill.), L116A Ellipsometer (400 to 1200 angstrom range). Two spin speeds are then selected from this data to spin the CaF$_2$ substrates for the spectrometer measurement.

b) Two CaF$_2$ substrates (1" dia.×0.80" thick) are selected and each is run as a reference data file on a McPherson Spectrometer (Chemsford, Mass.), 234/302 monochromer, using a 632 Deuterium Source, 658 photomultiplier, and Keithley 485 picoammeter.

c) Two speeds are selected from the silicon wafer data a) to spin the sample material onto the $CaF_2$ reference substrates (e.g., 2000 and 4000 rpm) to achieve the desired film thickness. Then each is baked at 120° C. for 30 min. and the sample spectra is collected on the McPherson Spectrometer; the sample files are then divided by the reference $CaF_2$ files.

d) The resulting absorbance files are then adjusted (sample film on $CaF_2$ divided by $CaF_2$ blank) for film thickness to give absorbance per micron (abs/mic), which is done using GRAMS386 and KALEIDA-GRAPH software.

The term "clearing dose" indicates the minimum exposure energy density (e.g., in units of $mJ/cm^2$) to enable a given photoresist film, following exposure, to undergo development.

Example 1

Polymer of TFE and NB—OAc

A 200 mL pressure vessel was charged with 45.6 g NB—OAc, 75 mL of 1,1,2-trichlorotrifluoroethane and 1.2 g Perkadox®16N. The vessel was closed, cooled, evacuated and purged with nitrogen several times and then charged with 45 g of TFE. The vessel was shaken at 50° C. for 18 hr. The vessel was cooled and the contents were poured slowly into excess methanol. The precipitated polymer was washed with methanol and dried overnight in a vacuum oven to give 13.2 g of polymer. From its $^{13}C$ NMR spectrum, the polymer composition was found to be 43% TFE and 57% NB—OAc. DSC: $T_g$=185° C. GPC: $M_n$=6000; $M_w$=9100; $M_w/M_n$=1.50. Anal. Found: C, 55.50%; H, 5.96%; F, 25.17%.

Example 2

Polymer of TFE, NB—FOH, NB—F—OMOM and NB—OAc

A 200 mL pressure vessel was charged with 34.8 g NB—F—OH, 20.0 g NB—F—OMOM, 9.12 g NB—OAc, 75 mL of 1,1,2-trichlorotrifluoroethane and 1.0 g Perkadox®16N. The vessel was closed, cooled, evacuated and purged with nitrogen several times and then charged with 36 g of TFE. The vessel was shaken at 50° C. for 18 hr. The vessel was cooled and the contents were poured slowly into excess hexane. The precipitated polymer was washed with hexane and dried overnight in a vacuum oven to give 8.8 g of polymer. DSC: $T_g$=143° C. GPC: $M_n$=4500; $M_w$=6300; $M_w/M_n$=1.40. Anal. Found: C, 44.58; H, 4.11; F, 40.55%.

Example 3

Polymer of TFE, NB—FOH, NB—F—OMOM and NB—OH

A 7.2 g portion of the polymer prepared in Example 2 was dissolved in 100 mL THF at room temperature. A solution of 1.2 g of sodium hydroxide in 6 mL methanol and 6 mL water was added. The resulting solution was stirred overnight at room temperature. The polymer was precipitated by slowly pouring the solution into 1-L of ice water and 10 mL concentrated hydrochloric acid. The polymer was washed with water, and dried overnight in a vacuum oven at 85° C. giving 5.8 g of product. From its $^{13}C$ NMR spectrum, the polymer composition was found to be 46% TFE, 28% NB—FOH, 13% NB—F—OMOM and 13% NB—OH. DSC: $T_g$=137° C. GPC: $M_n$=4600, $M_w$=6300, $M_w/M_n$=1.38. Anal. Found: C, 43.70; H, 3.89; F, 37.44%. The polymer absorbance at 157 nm was found to be 1.49 $\mu m^{-1}$.

Example 4

Polymer of TFE, NB—FOH, NB—F—OMOM and NB—OAc

A 200 mL pressure vessel was charged with 17.4 g NB—FOH, 20.0 g NB—F—OMOM, 9.12 g NB—OAc, 75 mL of 1,1,2-trichlorotrifluoroethane and 1.0 g Perkadox®16N. The vessel was closed, cooled, evacuated and purged with nitrogen several times and then charged with 42 g of TFE. The vessel was shaken at 50° C. for 18 hr. The vessel was cooled and the contents were poured slowly into excess hexane. The precipitated polymer was washed with hexane and dried overnight in a vacuum oven to give 13.5 g of polymer. DSC: $T_g$=141° C. GPC: $M_n$=5900; $M_w$=8600; $M_w/M_n$=1.45. Anal. Found: C, 44.53; H, 4.03; F, 40.63%.

Example 5

Polymer of TFE, NB—FOH, NB—F—OMOM and NB—OH

A 12 g portion of the polymer of Example 4 was dissolved in 100 mL THF at room temperature. A solution of 2 g of sodium hydroxide in 10 mL methanol and 10 mL water was added. The resulting solution was stirred overnight at room temperature. The polymer was precipitated by slowly pouring the solution into 1-L of ice water and 10 mL concentrated hydrochloric acid. The polymer was washed with water, and dried overnight in a vacuum oven at 85° C. giving 10.4 g of product. From its $^{13}C$ NMR spectrum, the polymer composition was found to be 48% TFE, 19% NB—F—OH, 15% NB—F—OMOM and 18% NB—OH. DSC: $T_g$=137° C. GPC: $M_n$=5900, $M_w$=8700, $M_w/M_n$=1.47. Anal. Found: C, 44.11; H, 4.02; F, 39.75%.

Example 6

Polymer of TFE, NB—FOH, NB—F—OMOM and NB—OAc

A 200 mL pressure vessel was charged with 34.8 g NB—FOH, 10.0 g NB—F—OMOM, 13.79 NB—OAc, 75 mL of 1,1,2-trichlorotrifluoroethane and 1.0 g Perkadox®16N. The vessel was closed, cooled, evacuated and purged with nitrogen several times and then charged with 36 g of TFE. The vessel was shaken at 50° C. for 18 hr. The vessel was cooled and the contents were poured slowly into excess hexane. The precipitated polymer was washed with hexane and dried overnight in a vacuum oven to give 10.7 g of polymer. DSC: $T_g$=151° C. GPC: $M_n$=4800; $M_w$=6800; $M_w/M_n$=1.42. Anal. Found: C, 45.32; H, 4.05; F, 39.32%.

Example 7

Polymer of TFE, NB—FOH, NB—F—OMOM and NB—OH

A 9.6 g portion of the polymer of Example 6 was dissolved in 120 mL THF at room temperature. A solution of 1.6 g of sodium hydroxide in 8 mL methanol and 8 mL water was added. The resulting solution was stirred overnight at room temperature. The polymer was precipitated by slowly pouring the solution into 1-L of ice water and 10 mL concentrated hydrochloric acid. The polymer was washed with water, and dried overnight in a vacuum oven at 85° C. giving 7.85 g of product. From its $^{13}$C NMR spectrum, the polymer composition was found to be 49% TFE, 27% NB—F—OH, 7% NB—F—OMOM and 18% NB—OH. DSC: $T_g$=147° C. GPC: $M_n$=4600, $M_w$=6600, $M_w/M_n$=1.44. Anal. Found: C, 44.86; H, 4.10; F, 37.15%. The polymer absorbance at 157 nm was found to be 1.25 $\mu m^{-1}$.

Example 8

Polymer of TFE, NB—OAc and t-BuAc

A metal pressure vessel of approximately 270 mL capacity was charged with 36.1 g NB—OAc, 1.6 g tert-butyl acrylate and 50 mL Solkane 365. The vessel was closed, cooled to about −15° C. and pressured to 400 psi with nitrogen and vented several times. The reactor contents were heated to 50° C. TFE was added to a pressure of 330 psi and a pressure regulator was set to maintain the pressure at 330 psi throughout the polymerization by adding TFE as required. A solution of 39.6 g of NB—F—OAc and 11.1 g of tert-butyl acrylate diluted to 100 mL with Solkane 365 mfc was pumped into the reactor at a rate of 0.10 mL/minute for 12 hr. Simultaneously with the monomer feed solution, a solution of 7.3 g Perkadox®16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours of reaction time, the vessel was cooled to room temperature and vented to 1 atmosphere. The recovered polymer solution was added slowly to an excess of hexane while stirring. The precipitate was filtered, washed with hexane and air-dried. The resulting solid was dissolved in a mixture of THF and Solkane 365 mfc and added slowly to excess to hexane. The precipitate was filtered, washed with hexane and dried in a vacuum oven overnight to give 32.3 g of white polymer. From its $^{13}$C NMR spectrum, the polymer composition was found to be 32% TFE, 43% NB—OAc and 25% t-BuAc. DSC: $T_g$=157° C. GPC: $M_n$=6100; $M_w$=9800; $M_w/M_n$=1.62. Anal. Found: C, 58.77; H, 6.41; F, 17.76%.

Example 9

Polymer of TFE, NB—OH and t-BuAc

A 30.64 g portion of the polymer of Example 8 was dissolved in 200 mL of THF. A solution of 8.0 g of sodium hydroxide in 25 mL of water and 25 mL of methanol was added dropwise. The resulting mixture was stirred overnight at room temperature. The solution was poured into excess aqueous 1% hydrochloric acid. The precipitate was filtered and washed with water. The polymer was dissolved in 200 mL of acetone and treated with 4 mL of 36% aqueous hydrochloric acid. The solution was filtered and poured into excess water. The precipitate was filtered, washed with water and dried to give 25.8 g of polymer. DSC: $T_g$=127° C. GPC: $M_n$=5600; $M_w$=8700; $M_w/M_n$=1.75. Anal. Found: C, 58.51; H, 6.29; F, 19.65%.

Example 10

Polymer of TFE, NB—FOH, NB—OAc and t-BuAc

A metal pressure vessel of approximately 270 mL capacity was charged with 32.6 g NB—FOH, 19.0 g NB—OAc, 1.6 g tert-butyl acrylate and 40 mL Solkane 365. The vessel was closed, cooled to about −15° C. and pressured to 400 psi with nitrogen and vented several times. The reactor contents were heated to 50° C. TFE was added to a pressure of 330 psi and a pressure regulator was set to maintain the pressure at 330 psi throughout the polymerization by adding TFE as required. A solution of 35.24 g of NB—FOH, 21.11 g NB—OAc and 11.1 g of tert-butyl acrylate diluted to 100 mL with Solkane 365 mfc was pumped into the reactor at a rate of 0.10 mL/minute for 12 hr. Simultaneously with the monomer feed solution, a solution of 7.3 g Perkadox®16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After a 16 hours reaction time, the vessel was cooled to room temperature and vented to 1 atmosphere. The recovered polymer solution was added slowly to an excess of hexane while stirring. The precipitate was filtered, washed with hexane and air-dried. The resulting solid was dissolved in a mixture of THF and Solkane 365 mfc and added slowly to excess to hexane. The precipitate was filtered, washed with hexane and dried in a vacuum oven overnight to give 42.8 g of white polymer. From its $^{13}$C NMR spectrum, the polymer composition was found to be 31% TFE, 20% NB—FOH, 23% NB—OAc and 25% t-BuAc. DSC: $T_g$=151° C. GPC: $M_n$=5600; $M_w$=8700; $M_w/M_n$=1.56. Anal. Found: C, 51.95; H, 4.94; F, 27.67%.

Example 11

Polymer of TFE, NB—FOH, NB—OH and t-BuAc

A 40.0 g portion of the polymer of Example 10 was dissolved in 200 mL of THF. A solution of 8.8 g of sodium hydroxide in 25 mL of water and 25 mL of methanol was added dropwise. The resulting mixture was stirred overnight at room temperature. The solution was poured into excess aqueous 1% hydrochloric acid. The precipitate was filtered and washed with water. The polymer was dissolved in 200 mL of acetone and treated with 4 mL of 36% aqueous hydrochloric acid. The solution was filtered and poured into excess water. The precipitate was filtered, washed with water and dried to give 35.0 g of polymer. From its $^{13}$C NMR spectrum, the polymer composition was found to be 32% TFE, 26% NB—FOH, 18% NB—OH and 26% t-BuAc. DSC: $T_g$=166° C. GPC: $M_n$=4000; $M_w$=7800; $M_w/M_n$=1.95. Anal. Found: C, 51.51; H, 5.20; F, 29.67%.

Example 12

Polymer of TFE, NB—OAc and MAdA

A metal pressure vessel of approximately 270 mL capacity was charged with 41.045 g NB—OAc, 6.60 g MAdA and 25 mL Solkane 365. The vessel was closed, cooled to about −15° C. and pressured to 400 psi with nitrogen and vented several times. The reactor contents were heated to 50° C. TFE was added to a pressure of 280 psi and a pressure regulator was set to maintain the pressure at 280 psi throughout the polymerization by adding TFE as required. A solution of 31.67 g of NB—OAc and 45.83 g MAdA diluted to 100 mL with Solkane 365 mfc was pumped into the reactor at a rate of 0.10 mL/minute for 12 hr. Simultaneously with the monomer feed solution, a solution of 7.3 g Perkadox®16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After a 16 hours reaction time, the vessel was cooled to room temperature and vented to 1 atmosphere. The reactor contents were a mixture of solid and liquid. The liquid was allowed to evaporate and the residue was dissolved in THF and precipitated into excess hexane. The precipitate was redissolved in THF, precipitated into hexane, washed with hexane and dried in a vacuum oven overnight to give 31.8 g of white polymer. From its $^{13}$C NMR spectrum, the polymer composition was found to be 12% TFE, 36% NB—OAc and 52% MAdA. DSC: $T_g$=171° C. GPC: $M_n$=6100; $M_w$=21000; $M_w/M_n$=3.46. Anal. Found: C, 71.34; H, 8.33; F, 4.91%.

Example 13

Polymer of TFE, NB—OH, NB—OAc and MAdA

A 30 g portion of the polymer of Example 12 was dissolved in 200 mL of THF and 25 mL methanol. Tetramethylammonium hydroxide (44 g, 25% solution in water) was added. The resulting mixture was stirred overnight at room temperature. The reaction mixture separated into two phases. The top phase was added slowly to 3.6 L of 1% aqueous hydrochloric acid. The polymer was filtered, dissolved in THF, treated with 2 mL of concentrated hydrochloric acid and poured into 3.6 L water. The precipitate was filtered and dried in a vacuum oven to give 27.7 g of product. DSC: $T_g$=169° C. GPC: $M_n$=5400; $M_w$=19800; $M_w/M_n$=3.70. $^{13}$C NMR analysis showed the polymer composition to be 12% TFE, 23% NB—OH, 10% NB—OAc and 56% MAdA. Analysis indicates that a portion of NB—OAc was converted to NB—OH.

Example 14

The following solution was prepared and magnetically stirred overnight.

| Component | Wt. (gm) |
|---|---|
| TFE/NB—FOH/NB—F—OMOM/NB—OH polymer in Example 3 | 0.490 |
| 2-Heptanone | 5.121 |
| t-Butyl Lithocholate | 0.090 |
| 6.82% (wt) solution of triphenylsulfonium nonaflate dissolved in 2-heptanone which had been filtered through a 0.45 μm PTFE syringe filter. | 0.299 |

Process for Positive Imaging

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 mL of hexamethyldisilazane (HMDS) primer and spinning at 5000 rpm for 10 seconds. Then about 2-3 mL of the above solution of Example 14, after filtering through a 0.45 μm PTFE syringe filter, were deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 30 seconds, providing an unattenuated dose of 20.5 mJ/cm². By using a mask with 18 positions of varying neutral optical density, a wide variety of exposure doses was generated. After exposure, the exposed wafer was baked at 120° C. for 120 seconds.

The wafer was developed in aqueous tetramethylammonium hydroxide (TMAH) solution (OHKA NMD-3, 2.38% TMAH solution) for 60 seconds.

Example 15

A solution was prepared as in Example 14, except using the TFE/NB—FOH/NB—F—OMOM/NB—OH polymer prepared in Example 7. The solution was spin coated and processed as in Example 14, except that a post-exposure bake temperature of 100° C. was used. A positive image was formed.

Example 16

The following solution was prepared and magnetically stirred overnight.

| Component | Wt. (gm) |
|---|---|
| TFE/NB—FOH/t-BuAc/NB—OH polymer in Example 11 | 1.159 |
| 2-Heptanone | 8.243 |
| 6.82% (wt) solution of triphenylsulfonium nonaflate dissolved in 2-heptanone which had been filtered through a 0.45 μm PTFE syringe filter. | 0.598 |

Sample preparation was as in Example 14, except without t-butyl lithocholate and except that a 2500 rpm spin speed was used for the above solution. Imaging was performed as in Example 14, except that exposure time was 180 seconds, providing an unattenuated dose of 270.1 mJ/cm². After exposure, the wafer was baked at 100° C. for 60 seconds. The wafer was developed in aqueous tetramethylammonium hydroxide (TMAH) solution (Shipley LDD-26W, 0.26N) for 60 seconds, yielding a positive image.

Example 17

The following solution was prepared and magnetically stirred overnight.

| Component | Wt. (gm) |
|---|---|
| TFE/NB—F—OH/t-BuAc/NB—OH polymer in Example 11 | 0.535 |
| 2-Heptanone | 4.121 |
| t-Butyl Lithocholate | 0.045 |
| 6.82% (wt) solution of triphenylsulfonium nonaflate dissolved in 2-heptanone which had been filtered through a 0.45 μm PTFE syringe filter. | 0.299 |

This solution was processed as in Example 16 except with the addition of t-butyl lithocholate to yield a positive image.

Example 18

The following solution was prepared and magnetically stirred overnight.

| Component | Wt. (gm) |
|---|---|
| TFE/NB—OH/NB—OAc/MAdA polymer in Example 13 | 0.580 |
| 2-Heptanone | 4.121 |
| 6.82% (wt) solution of triphenylsulfonium nonaflate dissolved in 2-heptanone which had been filtered through a 45 μm PTFE syringe filter. | 0.299 |

The solution was processed as in Example 16, except that exposure time was 15 seconds, providing an unattenuated does of 22.5 mJ/cm², and post-exposure bake temperature was 135° C., yielding a positive image with a clearing does of 2.2 mJ/cm².

Example 19

The following solution was prepared and magnetically stirred overnight.

| Component | Wt. (gm) |
|---|---|
| TFE/NB—OH/NB—OAc/MAdA polymer in Example 13 | 0.460 |
| 2-Heptanone | 4.121 |
| t-Butyl Lithocholate | 0.120 |
| 6.82% (wt) solution of triphenylsulfonium nonaflate dissolved in 2-heptanone which had been filtered through a 45 μm PTFE syringe filter. | 0.299 |

The solution was processed as in Example 18 except with the addition of t-butyl lithocholate, yielding a positive image with a clearing dose of 2.2 mJ/cm².

What is claimed is:

1. A fluorine-containing copolymer comprising:
   a) a repeat unit derived from an ethylenically unsaturated compound having at least one fluorine atom covalently attached to an ethylenically unsaturated carbon atom; and
   b) a repeat unit derived from an ethylenically unsaturated cyclic compound of structure:

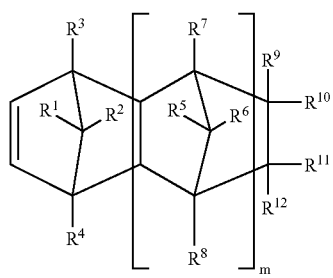

wherein m is 0, 1 or 2;
$R^1$ to $R^{12}$ are independently H, halogen, carboxyl, OH, or $O_2C—R^{13}$, wherein $R^{13}$ is a $C_1$-$C_{20}$ hydrocarbon group and at least one of $R^1$ to $R^{12}$ is $O_2C—R^{13}$.

2. The fluorine-containing copolymer of claim 1, wherein $R^1$ to $R^{11}$ are each hydrogen, m is zero, and $R^{12}$ is $O_2C—R^{13}$, wherein $R^{13}$ is a $C_1$-$C_{20}$ hydrocarbon group.

3. The fluorine-containing copolymer of claim 2, wherein $R^{13}$ is a linear or branched alkyl group of 1 to 10 carbon atoms.

4. The fluorine-containing copolymer of claim 3, wherein $R^{13}$ is methyl, ethyl or propyl.

5. The fluorine containing copolymer of claim 1, wherein the halogen is chlorine, fluorine, or bromine.

6. The fluorine-containing copolymer of claim 1, wherein repeat unit (a) is derived from tetrafluoroethylene, hexafluoropropylene, chlorotrifluoroethylene, trifluoroethylene, vinyl fluoride, vinylidene fluoride, perfluoro-(2,2-dimethyl-1,3-dioxole), perfluoro-(2-methylene-4-methyl-1,3-dioxolane), $CF_2$=$CFO(CF_2)_tCF$=$CF_2$, wherein t is 1 or 2, or $R_fOCF$=$CF_2$ wherein $R_f$ is a saturated fluoroalkyl group of from 1 to 10 carbon atoms.

7. The fluorine-containing copolymer of claim 6, wherein repeat unit (a) is derived from tetrafluoroethylene.

8. The fluorine-containing copolymer of claim 1, further comprising a repeat unit derived from tert-butyl acrylate or methyl adamantyl acrylate.

9. The fluorine-containing copolymer of claim 1, further comprising a repeat unit which is a norbornyl fluoroalcohol or a protected norbornyl fluoroalcohol.

10. The fluorine-containing copolymer of claim 1, further comprising a fluoroalcohol group derived from an ethylenically unsaturated compound containing a fluoroalcohol group having the structure:

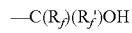

wherein $R_f$ and $R_f'$ are the same or different fluoroalkyl groups of from 1 to 10 carbon atoms or taken together are $(CF_2)_n$ wherein n is 2 to 10.

11. The fluorine containing copolymer of claim 1, further comprising an acid-containing or protected acid-containing structural unit:

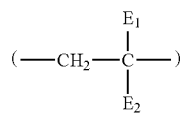

wherein $E_1$ is H or $C_1$-$C_{12}$ alkyl; $E_2$ is $CO_2E_3$, or $SO_3E$; and E and $E_3$ are H or unsubstituted or heteroatom-substituted $C_1$-$C_{12}$ alkyl.

12. The fluorine containing copolymer of claim 11, wherein the heteroatom is S, O or N.

* * * * *